United States Patent
Gustlin (10) Patent No.: US 8,949,699 B1
(45) Date of Patent: Feb. 3, 2015

(54) CIRCUIT FOR FORWARD ERROR CORRECTION ENCODING OF DATA BLOCKS ACROSS MULTIPLE DATA LANES

(75) Inventor: Mark A. Gustlin, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 202 days.

(21) Appl. No.: 13/598,548

(22) Filed: Aug. 29, 2012

(51) Int. Cl.
*H03M 13/00* (2006.01)

(52) U.S. Cl.
USPC .......................................................... 714/784

(58) Field of Classification Search
CPC ............. H03M 13/152; H03M 13/29; H03M 13/2927; H03M 13/2909; H03M 13/2903; H03M 13/1515; H03M 13/47; H03M 13/6306; H03M 5/145; H03M 13/05; H03M 13/13; H04L 1/0045; H04L 1/0041; H04L 1/0042; H04B 10/1121; H04J 14/02; H04J 3/1611; H04J 14/0223
See application file for complete search history.

(56) References Cited

U.S. PATENT DOCUMENTS

| | | | | |
|---|---|---|---|---|
| 5,757,416 | A * | 5/1998 | Birch et al. .................... | 725/144 |
| 6,810,499 | B2 * | 10/2004 | Sridharan et al. .............. | 714/755 |
| 6,868,514 | B2 * | 3/2005 | Kubo et al. .................... | 714/755 |
| 8,370,704 | B2 * | 2/2013 | Ganga et al. .................... | 714/757 |
| 2003/0179783 | A1 * | 9/2003 | Uekama et al. ................ | 370/535 |
| 2004/0096220 | A1 * | 5/2004 | Murata .......................... | 398/79 |
| 2005/0005225 | A1 * | 1/2005 | Johnson et al. ................ | 714/758 |
| 2009/0285155 | A1 * | 11/2009 | Scarpa et al. .................. | 370/326 |
| 2013/0117639 | A1 * | 5/2013 | Ganga et al. ................... | 714/776 |

OTHER PUBLICATIONS

Gustlin, Mark A. et al, "Backplane NRZ FEC Baseline Proposal", IEEE P802.3bj Task Force, Mar. 2012, pp. 1-22, Hawaii USA.

* cited by examiner

*Primary Examiner* — Guerrier Merant
(74) *Attorney, Agent, or Firm* — LeRoy D. Maunu (57) ABSTRACT

In one embodiment, a method for communicating a sequence of data bits is provided. FEC coding is performed on a received sequence of data bits to produce an FEC coded sequence formatted for a first set of N data lanes. The FEC coded sequence includes FEC data blocks, in which each FEC data block has a plurality of data symbols. Alignment markers are added to the FEC coded sequence and the FEC coded sequence is multiplexed to produce a multiplexed sequence formatted for a second set of M data lanes. The multiplexing is performed only at boundaries between the data symbols or the alignment markers. The multiplexed sequence is transmitted on M data lanes.

20 Claims, 7 Drawing Sheets

CIRCUIT FOR FORWARD ERROR CORRECTION ENCODING OF DATA BLOCKS ACROSS MULTIPLE DATA LANES

FIELD OF THE INVENTION

One embodiment generally relates to high-speed data communication.

BACKGROUND

In many high-speed data applications, transmission over a single transmission line may be insufficient to provide the required bandwidth for communication of a signal. For example, communication bandwidth may be increased for such applications by combining bandwidth of a plurality of data lanes for communication of the signal. For instance, IEEE Std. 802.3ba describes a method of transmission over a plurality of lanes as a standardized technology for 100-Gbps Ethernet. The 100-Gbps Ethernet combines either ten 10-Gbps data lanes or four 25-Gbps data lanes to realize a bandwidth of 100-Gbps.

In different communication protocols, methods of multi-lane communication are defined by a physical coding sublayer (PCS) and a physical medium attachment (PMA) sublayer. The PCS/PMA sublayers perform a number of functions including delineation of Ethernet data frames, transport of fault information, clock recovery, and distributing data across multiple (merged) data lanes. The PCS/PMA sublayers also support reassembly of received data from multiple data lanes. In some protocols, the PCS/PMA sublayers are scalable and can be dynamically adjusted to merge different combinations of data lanes to form communication channels having different data widths, as required by a particular application. Such configurability allows the available data lanes to be more effectively allocated to achieve bandwidth required for different communication channels.

SUMMARY

In one embodiment, a method for communicating a sequence of data bits is provided. FEC coding is performed on a received sequence of data bits to produce an FEC coded sequence formatted for a first set of N data lanes. The FEC coded sequence includes FEC data blocks, in which each FEC data block has a plurality of data symbols. Alignment markers are added to the FEC coded sequence and the FEC coded sequence is multiplexed to produce a multiplexed sequence formatted for a second set of M data lanes. The multiplexing is performed only at boundaries between the data symbols or the alignment markers. The multiplexed sequence is transmitted on M data lanes.

In another embodiment, a communication system is provided. The communication system includes an FEC encoding circuit configured to perform FEC encoding of a received sequence of data bits to produce an FEC coded sequence formatted on a first set of N data lanes. An alignment marker circuit is coupled to the FEC encoding circuit. The alignment marker circuit is configured to periodically add alignment markers in the FEC coded sequence on each of N data lanes. A multiplexing circuit is coupled to the alignment marker circuit. The multiplexing circuit is configured to multiplex the N data lanes of the FEC coded sequence to produce a multiplexed sequence on a second set of M data lanes. The multiplexing of the data lanes is performed at boundaries between data symbols of the FEC coded sequence. A driver circuit is coupled to the multiplexing circuit and configured to transmit the multiplexed sequence over a data bus having M data lanes.

In yet another embodiment, a receiver circuit is provided. The receiver circuit, includes an alignment marker detection circuit configured to receive a multiplexed data sequence from a data bus having a first set of M data lanes and locate data symbol boundaries in the multiplexed data sequence. A demultiplexing circuit is coupled to the alignment marker detection circuit. The demultiplexing circuit is configured to demultiplex the multiplexed data sequence to produce an FEC coded sequence on a third set of N data lanes. The demultiplexing is performed at the located symbol boundaries in the multiplexed data sequence. An FEC decoder circuit (228) coupled to the demultiplexing circuit. The FEC decoder circuit is configured to perform FEC decoding on the FEC coded sequence.

Other embodiments will be recognized from consideration of the Detailed Description and Claims, which follow.

BRIEF DESCRIPTION OF THE DRAWINGS

Various aspects and advantages of the disclosed embodiments will become apparent upon review of the following detailed description and upon reference to the drawings in which.

DETAILED DESCRIPTION OF THE DRAWINGS

Previous communication protocols with scalable PCS/PMA sublayers distribute and recombine data to/from multiple data lanes in the PMA sublayer using bitwise multiplexing/demultiplexing across the data lanes to be combined. Bitwise multiplexing is advantageous in that the multiplexing can be implemented with very simple and cost effective circuitry. However, bitwise multiplexing limits the ability to effectively provide other features for communication. For instance, bitwise multiplexing prevents the effective use of a number of forward error correction (FEC) methods. A method is described for implementing a scalable PCS/PMA system that can be adjusted to provide different combinations of communication channels and data widths along with strong methods for FEC such as Reed Solomon.

FEC adds metadata redundancy to a data packet by encoding the data packet prior to transmission. The added redundancy is used to detect and/or recover missing or corrupt portions of the received data. Some example error correction codes include Hamming, Bose-Chaudhuri-Hochquenghem (BCH), Reed-Solomon (RS), Viterbi, Trellis, etc.

Although embodiments are thought to be applicable to a number of different FEC coding schemes, for ease of explanation, examples and embodiments are primarily discussed with reference to Reed-Solomon FEC coding. Reed-Solomon coding is a very strong cyclic FEC code that may be used to correct multiple random symbol errors in a data block of symbols. However, bitwise multiplexing can significantly limit the efficiency of block FEC codes such as Reed-Solomon. As explained in more detail with reference to FIGS. 5 and 6 below, if a burst error of multiple successive bits occurs during transmission of a bit-wise multiplexed sequence, the burst error can affect a large number of FEC symbols in a data block. As a sequence is bit-wise demultiplexed into FEC data blocks, the bits affected by the burst error become distributed among various data. If the burst error becomes distributed over too many symbols, it may not be possible to correct all errors of the FEC data block. For instance, even if all errors in that one burst error can be corrected, it weakens the capability to correct for other errors within the same FEC block, which reduces the gain for the FEC.

In one or more implementations, scalable PCS/PMA layers can be adjusted to provide different combinations of communication channels and data widths along with block FEC coding, such as Reed Solomon FEC coding. In these implementations, data is multiplexed between data lanes only at symbol boundaries. As a result, the symbols of each FEC data block remain intact when multiplexed/demultiplexed. As a result, a burst error striking one symbol in the multiplexed sequence remains contained to that symbol when the sequence is demultiplexed. Accordingly, the FEC coding is able to correct more random burst errors.

Figure 1:
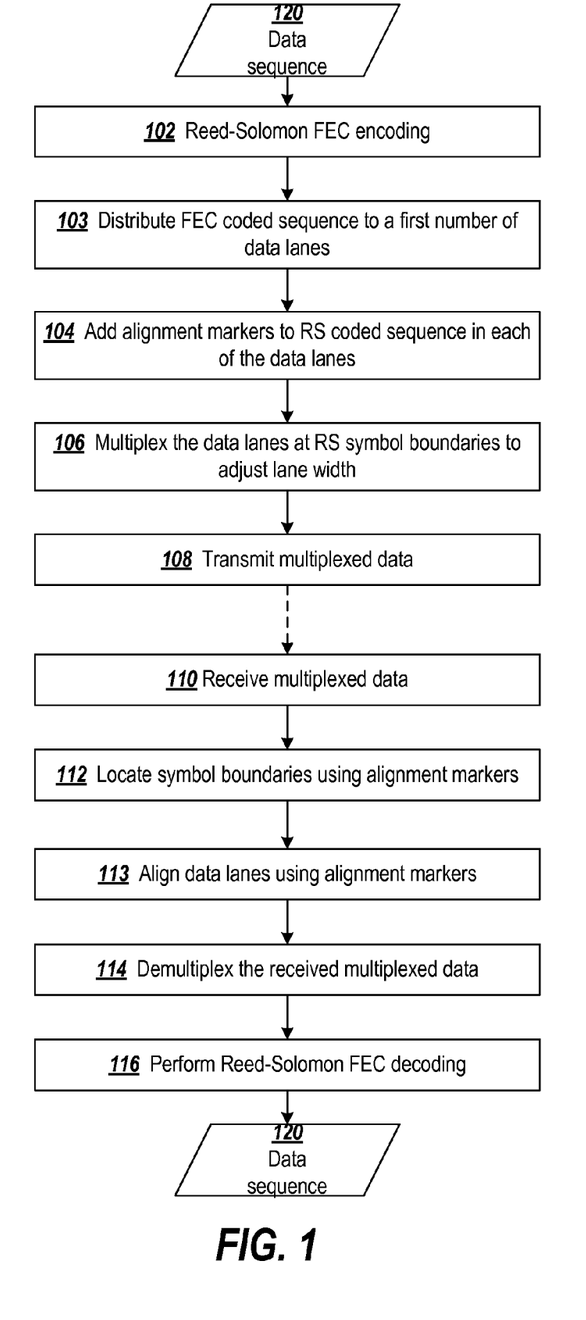
FIG. 1 shows a flowchart of a method for communicating data over a data bus.

FIG. 1 shows a flowchart of a method for communicating data over a data bus. A data sequence 120 is FEC encoded at block 102 to produce FEC coded data blocks. FEC encoding is performed by partitioning bits of the data sequence into bit groups referred to herein as data symbols. A number of data symbols are logically arranged into a data block and processed to calculate error correction data that may be used to detect and/or correct errors in the symbols of the block. The error correction data is appended to each respective data block to produce an FEC coded sequence.

The FEC coded sequence is reformatted to distribute data for transmission over a first number of data lanes at block 103. As indicated above, data may be multiplexed/demultiplexed in the PCS layer to transmit data on more or fewer data lanes to increase or decrease lane width of a communication channel used to transmit a data sequence. The width may be adjusted to include any number of lanes that is a factor of the original lane width of the FEC coded sequence. For instance, if the FEC coded sequence is originally formatted for transmission over 16 data lanes, the sequence may be multiplexed to transmit the sequence using 16, 8, 4, 2, or 1 data lanes. For ease of discussion regarding lane multiplexing/demultiplexing, the process of FIG. 1 is discussed with reference to an FEC coded data sequence that is initially formatted for transmission using N data lanes at block 103.

Alignment markers are periodically added to the N data lanes of the FEC coded data blocks at block 104. As discussed below, the alignment markers are later used to facilitate identification of symbol boundaries of the FEC data blocks. It is recognized that alignment markers are not required to be added for each FEC data block. This is because, a receiver can keep track of symbol boundaries in a data stream for a period of time once boundaries are located. In some implementations alignment markers are added periodically to the data lanes so symbol boundaries can be located within a reasonably short time period if the receiver loses track of the symbol boundaries due to transmission error.

Optionally, the N data lanes are multiplexed at block 106 to reformat the FEC coded sequence for transmission on a lesser number of data lanes (M). The multiplexing of the data lanes is performed at boundaries between the FEC data symbols. For instance, in an example of multiplexing two data lanes to a single data lane, data symbols are alternately selected from the two data lanes and placed onto the single data lane. In Example 1, data lanes 1 and 2 are multiplexed into a single data lane (i.e. multiplexed data lane).

Data lane 1 {AM, A, B, C, D, E}
Data lane 2 {AM, F, G, H, I, J}
Multiplexed Data Lane {AM, AM, A, F, B, G, C, H, D, I, E, J}

EXAMPLE 1

Symbols A-J and added alignment markers are alternately selected from data lanes 1 and 2 and placed into the multiplexed data lane. As indicated above, such multiplexing may be used to increase/decrease bandwidth on a multi-line data bus for transmission of the FEC coded data sequence. Multiplexing at symbol boundaries ensures that the symbols of each FEC data block remain intact when multiplexed/demultiplexed.

For ease of reference, the FEC coded sequence reformatted for transmission on M data lanes may be referred to as a multiplexed sequence. The multiplexed sequence is transmitted on M data lanes (dashed line from 108 to 110) at block 108 and is received by a receiver at block 110. The data symbol boundaries in the multiplexed sequence are located using the alignment markers at block 112. The alignment markers may also be used to align data lanes at block 113 to correct for skew that is encountered between the data lanes during transmission. For example, transmitted data symbols may arrive at slightly different times on different data lanes. The data lanes may be aligned, for instance, by buffering data received on each data lane using a FIFO buffer or variable delay circuit for an amount of time equal to the difference between the data lanes.

The multiplexed sequence is demultiplexed at block 114 to reformat the multiplexed sequence from M lanes to the original N data lane format used by the FEC coded sequence. This rearranges the symbols into the FEC coded data block produced at block 102. FEC decoding is performed at block 116 to detect and/or correct transmission errors and recover the original data sequence 120.

Figure 2:
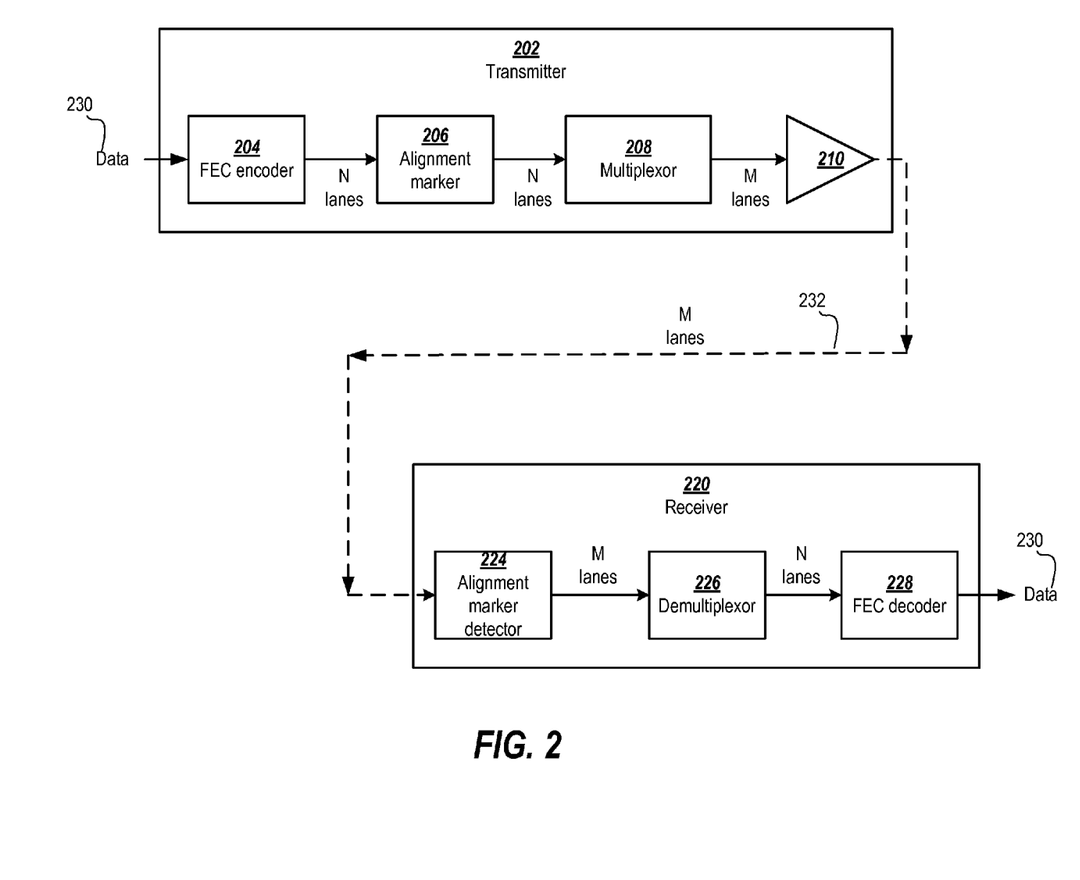
FIG. 2 shows a block diagram of transmitter and receiver circuits.

FIG. 2 shows a block diagram of transmitter and receiver circuits configured for lane multiplexing. The transmitter and receiver circuits may be configured to perform the process shown in FIG. 1. The transmitter circuit 202 includes an FEC encoder circuit 204 configured to receive a sequence of data bits and perform FEC encoding of the sequence of data bits to produce an FEC coded sequence formatted for transmission on N data lanes. An alignment marker circuit 206 is coupled to the FEC encoder circuit 204 and is configured to periodically add alignment markers in the FEC coded sequence on each of N data lanes.

In some embodiments, a multiplexor circuit 208 of the transmitter 202 is coupled to the alignment marker circuit 206 and is configured to multiplex the N data lanes of the FEC coded sequence to produce a multiplexed sequence formatted for transmission on a number of data lanes (M). As described with reference to FIG. 1, the multiplexing of the data lanes is performed at boundaries between data symbols of the FEC coded sequence. A driver circuit 210 is connected to the multiplexor circuit 208 and is configured to transmit the multiplexed signal to receiver circuit 220 over M data lanes.

An alignment marker detector circuit 224 of the receiver 220 is configured to receive the multiplexed data sequence formatted for a first set of M data lanes and locate data symbol boundaries in multiplexed data sequence 232. In some embodiments, the alignment marker detector circuit 224 may also be configured to align data lanes in the received data to correct for skew that is encountered between the data lanes during transmission, as discussed with reference to block 113 in FIG. 1.

A demultiplexor circuit 226 is coupled to the alignment circuit and is configured to reformat the multiplexed data sequence 232 from M lanes to the original N data lane format of the FEC coded sequence produced by the FEC encoder circuit 204. As described with reference to block 114 of FIG. 1, the demultiplexor circuit 226 is configured to demultiplex the multiplexed data sequence at the symbol boundaries located by the alignment circuit 224. The demultiplexing rearranges the symbols of the multiplexed data sequence into the FEC coded data blocks of the multiplexed sequence. An FEC decoder circuit 228 is coupled to the demultiplexor circuit 226 and configured to perform FEC decoding on the FEC data blocks to detect and/or correct transmission errors and recover the original data sequence 230.

The locating of symbol boundaries using the alignment markers is an effective mechanism for multiplexing data lanes at various locations in the processing chain without adversely effecting FEC correction ability. Although the example shown in FIG. 2 only multiplexes data between two data lane formats (i.e., N data lanes and M data lanes), it is recognized that the alignment markers may be utilized to facilitate multiplexing of data lanes at a number of intermediate circuits connected between the transmitter and the receiver. Furthermore, it is recognized that the multiplexing may not be performed at the transmitter. For instance, in some embodiments, the transmitter may encode and transmit an FEC encoded sequence without multiplexing. An intermediate circuit that receives the FEC encoded sequence may perform multiplexing before transmitting the multiplexed sequence to the receiver.

Figure 3:
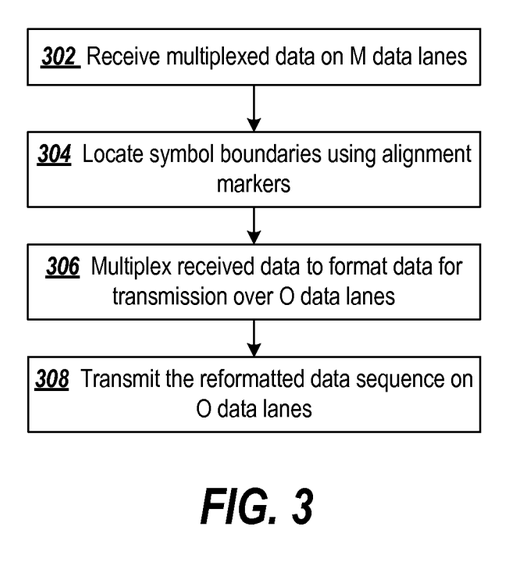
FIG. 3 shows a flowchart of a method for multiplexing data that may be performed by an intermediate circuit connecting the transmitter and receiver circuits.

FIG. 3 shows a flowchart of a method for multiplexing data that may be performed by an intermediate circuit connecting the transmitter and receiver circuits. A multiplexed data sequence is received by the intermediate circuit on M data line at block 302. Symbol boundaries are located using alignment markers at block 304. The multiplexed data sequence is again multiplexed at block 306 to format the sequence for transmission on O data lanes. The reformatted data sequence is transmitted (e.g. to a receiver circuit or other intermediate circuit) over the O data lanes at block 308.

Figure 4:
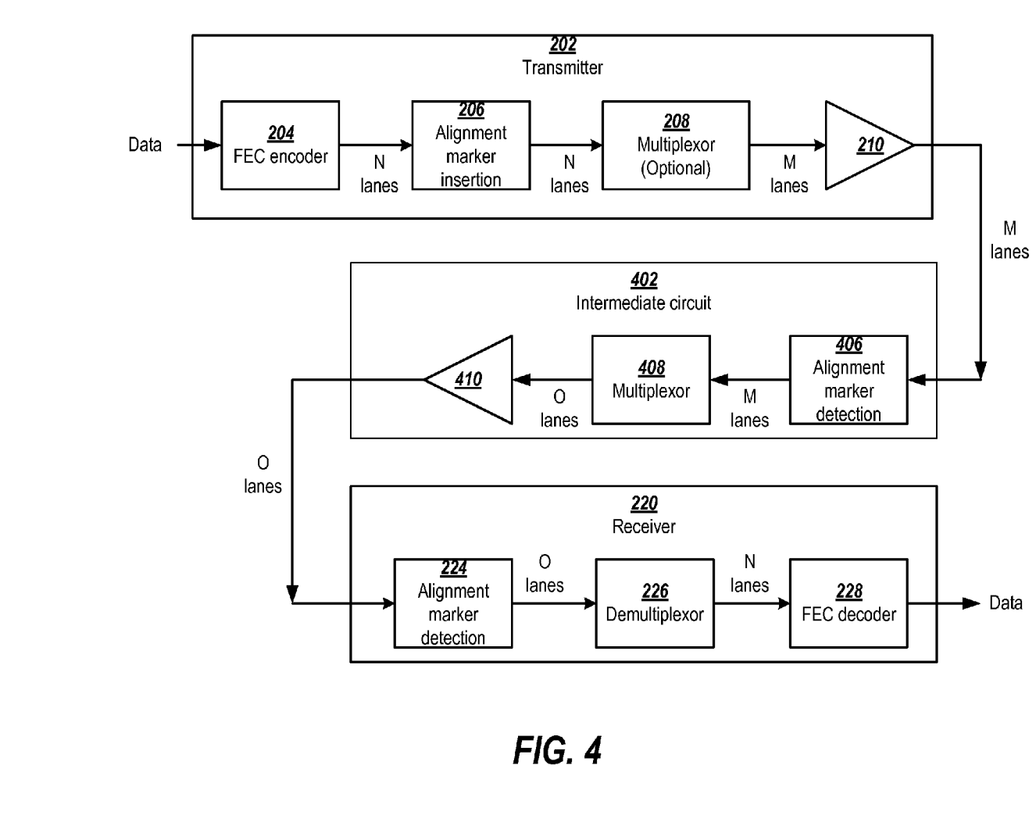
FIG. 4 shows a block diagram of transmitter and receiver circuits connected by an intermediate circuit.

FIG. 4 shows a block diagram of transmitter and receiver circuits connected by an intermediate circuit. For ease of explanation, the transmitter and receiver are described with reference to the transmitter 202 and receiver 220 in FIG. 2. As described with reference to FIG. 2, transmitter circuit 202 generates FEC coded data blocks in an N data lane format and, optionally, multiplexes the FEC coded data blocks to produce a multiplexed sequence in an M data lane format. As indicated above, in some embodiments, the transmitter may not multiplex the FEC coded sequence (i.e., M=N). Rather, the FEC coded sequence may later be multiplexed by an intermediate circuit. However, for ease of explanation, the transmitter 202 is discussed with reference to an implementation that outputs a multiplexed sequence.

In this example, the multiplexed sequence is transmitted to intermediate circuit 402 over a set of M data lanes. The intermediate circuit is configured to again multiplex the multiplexed sequence to format the sequence for transmission on a different number of data lanes. The intermediate circuit 402 includes an alignment marker detection circuit 406 that is configured to receive the multiplexed signal formatted for the set of M data lanes 232 and locate data symbol boundaries in received multiplexed data. A multiplexor circuit 408 is configured to multiplex the sequence from the M data lane format into a format for transmission on O data lanes. A driver circuit 410 is connected to the multiplexor circuit 408 and is configured to transmit the multiplexed signal to receiver circuit 220 over O data lanes.

Receiver circuit 220 is connected to receive the multiplexed signal 232 transmitted on the O data lanes. Operation of the receiver circuit is similar to that described with reference to FIG. 2. However, in this example, demultiplexor circuit 226 is configured to reformat the multiplexed data sequence from the O data lane format to the N data lane format used by the FEC coded sequence.

Figure 5:
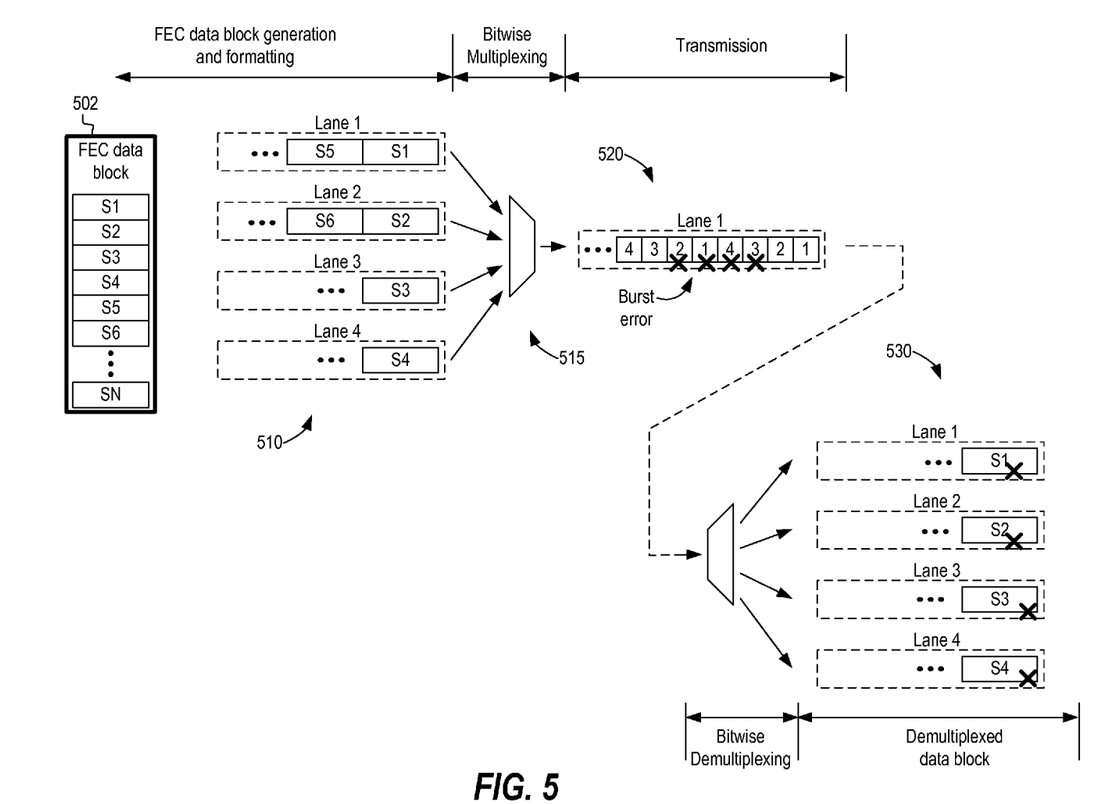
FIG. 5 illustrates effects of bitwise multiplexing on efficiency of FEC.

As indicated above, bitwise multiplexing of previous approaches can significantly limit the efficiency of block FEC codes such as Reed-Solomon. FIG. 5 illustrates effects of bitwise multiplexing on efficiency of FEC. As discussed above, an FEC data block (e.g., 502) arranges data of a data stream into a number of symbols (e.g., S1-Sn). In this example, symbols of FEC data block 502 are distributed among a first set of four data lanes 510 for transmission. The data lanes are then bitwise multiplexed by multiplexor 515 onto a single data lane 520 for transmission. Bitwise multiplexing selects bits from the lanes 1 through 4 in an alternating manner. FIG. 5, shows the first bit of each of the first set of four lanes 510 (i.e., first bit of symbols S1 through S4) being transmitted on the single data lane 520. A burst error (represented in FIG. 5 by X's) may strike a number of sequential bits transmitted in a data lane (e.g., 520). Although the burst error is localized in the single data lane 520, the bits in error become distributed among several FEC symbols (e.g., S1, S2, S3, and S4) when demultiplexed into four data lanes 530. The distribution of bits in error among the FEC data symbols increases the number of symbols that must be corrected. However, if the burst error becomes distributed over too many symbols, it may not be possible to correct all errors of the FEC data block and gain of the FEC coding is reduced.

Figure 6:
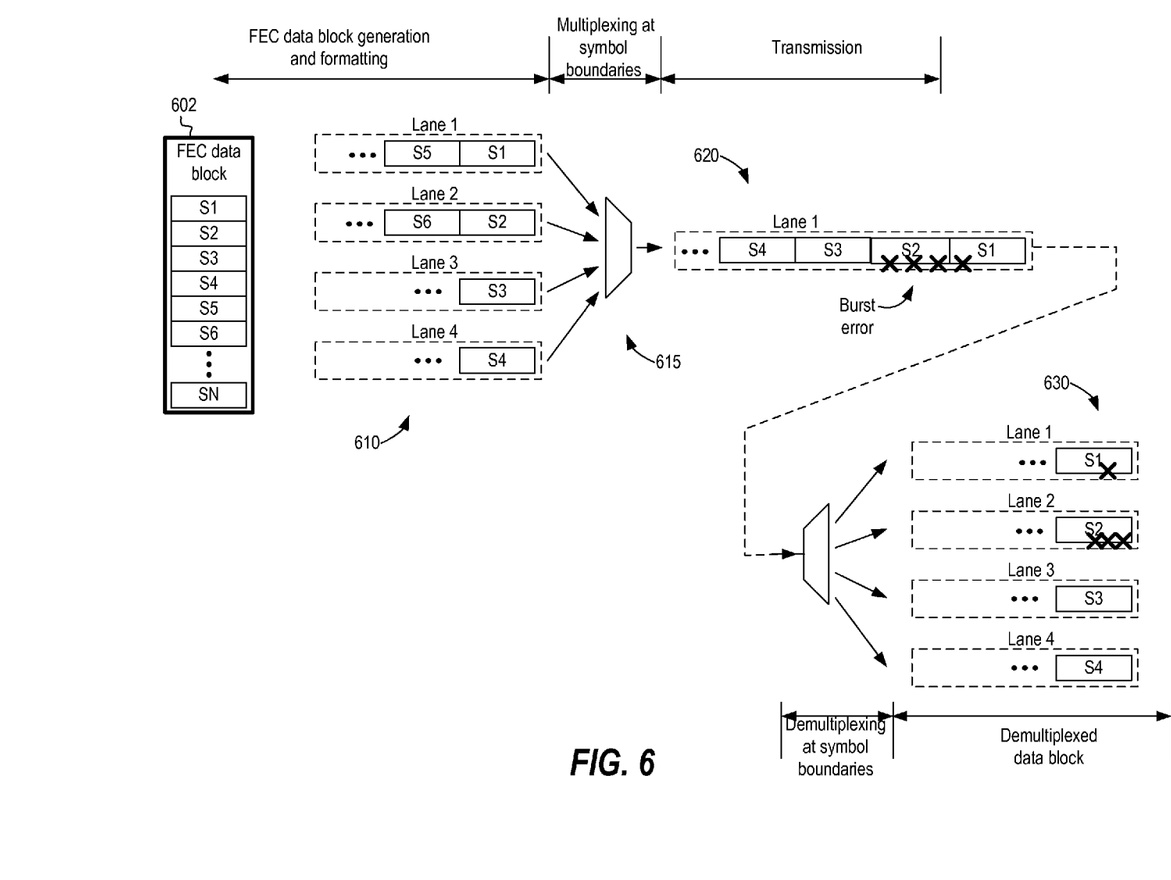
FIG. 6 illustrates effects of multiplexing at symbol boundaries on efficiency of FEC.

FIG. 6 illustrates effects of multiplexing at symbol boundaries on efficiency of FEC. Similar to FIG. 5, FEC data block (e.g., 602) arranges data of a data stream into a number of symbols (e.g., S1-Sn). Likewise, symbols of FEC data block 602 are distributed among a first set of four data lanes 610 for transmission. However, in this example, the data lanes 610 are then multiplexed at symbol boundaries by multiplexor 615 onto a single data lane 620 for transmission. As a result, the symbols of each FEC data block remain intact when multiplexed. In other words, each symbol is transmitted as a whole.

As discussed with reference to FIG. 5, a burst error (represented in FIG. 6 by X's) may strike a number of sequential bits transmitted in a data lane (e.g., 620). The single data lane 620 transmission is demultiplexed to format the data symbols into four data lane 530 format for FEC correction. In this example data is demultiplexed between data lanes only at symbol boundaries. As a result, the symbols (e.g. S1, S2, S3, and S4) of each FEC data block remain intact when demultiplexed. As a result, a burst error striking one symbol in the multiplexed sequence remains localized to that symbol when the sequence is demultiplexed. In this example, the burst error remains localized to data symbols S1 and S2.

Figure 7:
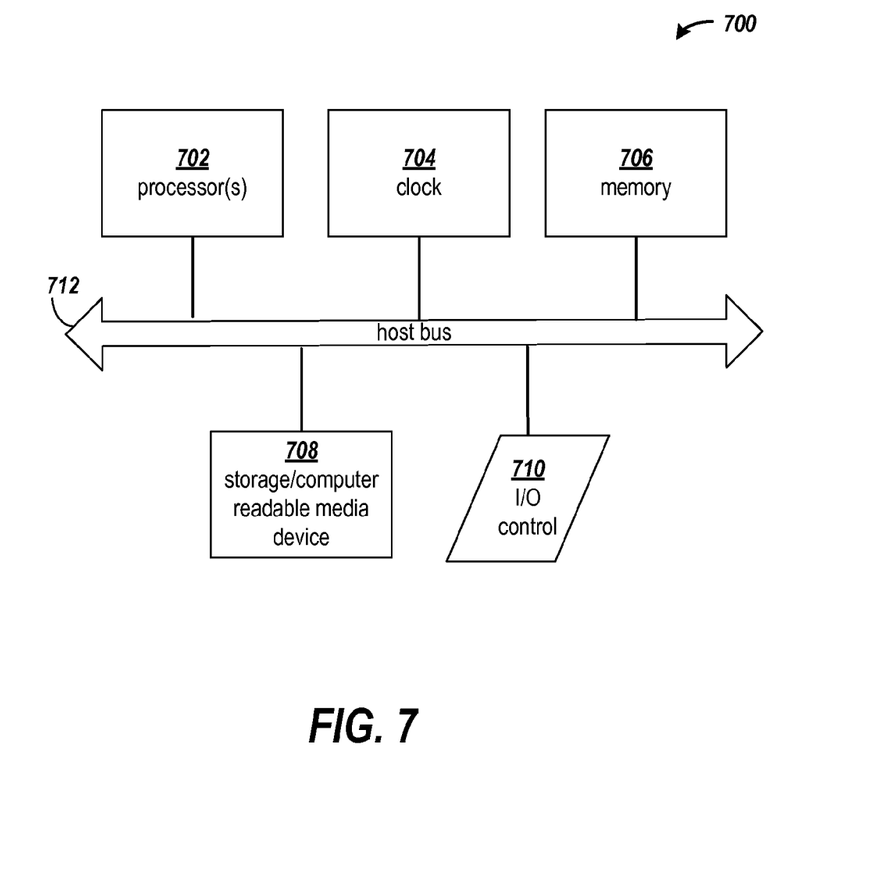
FIG. 7 shows a computing arrangement that may be used to perform the disclosed processes.

FIG. 7 shows a block diagram of an example computing arrangement that may be configured to implement the processes and functions described herein. It will be appreciated that various alternative computing arrangements, including one or more processors and a memory arrangement configured with program code, would be suitable for hosting the processes and data structures and implementing the algorithms of the different embodiments. The computer code, comprising the processes of one or more embodiments encoded in a processor executable format, may be stored and provided via a variety of computer-readable storage media or delivery channels such as magnetic or optical disks or tapes, electronic storage devices, or as application services over a network.

Processor computing arrangement 700 includes one or more processors 702, a clock signal generator 704, a memory unit 706, a storage unit 708, and an input/output control unit 710 coupled to a host bus 712. The arrangement 700 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor 702 may be one or more general-purpose processors, or a combination of one or more general-purpose processors and suitable co-processors, or one or more specialized processors (e.g., RISC, CISC, pipelined, etc.).

The memory arrangement 706 typically includes multiple levels of cache memory, and a main memory. The storage arrangement 708 may include local and/or remote persistent storage such as provided by magnetic disks (not shown), flash, EPROM, or other non-volatile data storage. The storage unit may be read or read/write capable. Further, the memory 706 and storage 708 may be combined in a single arrangement.

The processor arrangement 702 executes the software in storage 708 and/or memory 706 arrangements, reads data from and stores data to the storage 708 and/or memory 706 arrangements, and communicates with external devices through the input/output control arrangement 710. These functions are synchronized by the clock signal generator 704. The resource of the computing arrangement may be managed by either an operating system (not shown), or a hardware control unit (not shown).

The embodiments are thought to be applicable to a variety of systems for forward error correction. Other aspects and embodiments will be apparent to those skilled in the art from consideration of the specification. The embodiments may be implemented as one or more processors configured to execute software, as an application specific integrated circuit (ASIC), or as a logic on a programmable logic device. It is intended that the specification and illustrated embodiments be considered as examples only, with a true scope of the invention being indicated by the following claims.

What is claimed is:

1. A method for communicating a sequence of data bits, comprising:
   receiving the sequence of data bits;
   performing FEC coding on the sequence of data bits to produce an FEC coded sequence formatted for a first set of N data lanes, the FEC coded sequence including FEC data blocks, each FEC data block having a plurality of data symbols;
   adding alignment markers to the FEC coded sequence;
   multiplexing the FEC coded sequence to produce a multiplexed sequence formatted for a second set of M data lanes, M<N, the multiplexing being performed only at boundaries between the data symbols or the alignment markers; and
   transmitting the multiplexed sequence on the second set of M data lanes.

2. The method of claim 1, further comprising:
   multiplexing the multiplexed sequence on the second set of M data lanes, only at boundaries between sequential ones of the data symbols or the alignment markers in each of the second set of M data lanes, to produce a second multiplexed sequence formatted for a third set of O data lanes;
   transmitting the second multiplexed sequence on the third set of O data lanes;
   receiving the second multiplexed sequence formatted for the third set of O data lanes, and locating symbol boundaries in the second multiplexed sequence;
   demultiplexing the second multiplexed sequence at the located symbol boundaries to produce the FEC coded sequence formatted for transmission over N data lanes; and
   performing FEC decoding on the FEC coded sequence to produce the sequence of data bits.

3. The method of claim 1, wherein the FEC encoding is a block FEC encoding.

4. The method of claim 1, wherein a data width of each data lane of the second set of M data lanes is a multiple of a data width of the symbols.

5. The method of claim 1, wherein M is a factor of N.

6. The method of claim 1, wherein the addition of alignment markers to the FEC coded sequence includes, for each of the first set of N data lanes, periodically adding an alignment marker to the data lane.

7. The method of claim 1, further comprising using the alignment markers to align data lanes of the second set of M data lanes.

8. The method of claim 2, wherein:
   the receiving the sequence of data bits, the FEC coding, the addition of alignment markers, the multiplexing, and the transmitting are performed at a transmitter circuit; and
   the receiving the multiplexed sequence, the demultiplexing, and the FEC decoding are performed at a receiver circuit.

9. The method of claim 1, wherein:
   the receiving the sequence of data bits, the FEC coding, the addition of alignment markers, are performed at a transmitter circuit, and the multiplexing, and the transmitting are performed at an intermediate circuit connected to receive the FEC coded sequence on the first set of N data lanes;
   the method further comprising, at the transmitter circuit, transmitting the FEC coded sequence and alignment markers on the first set of N data lanes to the intermediate circuit.

10. A communication system, comprising:
   an FEC encoding circuit configured to receive a sequence of data bits and perform FEC encoding of the sequence of data bits to produce an FEC coded sequence formatted on a first set of N data lanes;
   an alignment marker circuit coupled to the FEC encoding circuit, the alignment marker circuit configured to periodically add alignment markers in the FEC coded sequence on each of N data lanes;
   a multiplexing circuit coupled to the alignment marker circuit, the multiplexing circuit configured to multiplex the N data lanes of the FEC coded sequence to produce a multiplexed sequence on a second set of M data lanes, M<N, the multiplexing of the data lanes being performed at boundaries between data symbols of the FEC coded sequence; and a driver circuit coupled to the multiplexing circuit and configured to transmit the multiplexed sequence over a data bus having M data lanes.

11. The communication system of claim 10, wherein the FEC encoding circuit, the alignment marker circuit, the multiplexing circuit, and the driver circuit are implemented in a transmitter circuit having an output coupled to the data bus having M data lanes.

12. The communication system of claim 10, wherein:
the FEC encoding circuit and the alignment marker circuit are implemented in a transmitter circuit having an output coupled to a data bus having N; and
the multiplexing circuit, and the driver circuit are implemented in an intermediate circuit having an input coupled to the data bus having N lanes and an output coupled to the data bus having M lanes.

13. The communication system of claim 10, further comprising:
a receiver circuit, including:
an alignment marker detection circuit configured to:
receive the multiplexed sequence from the data bus having the M data lanes; and
locate data symbol boundaries in the multiplexed data sequence;
a demultiplexing circuit coupled to the alignment marker detection circuit, the demultiplexing circuit configured to demultiplex the data sequence to produce an FEC coded sequence on a third set of N data lanes, the demultiplexing being performed at the located symbol boundaries in the data sequence; and
an FEC decoder circuit coupled to the demultiplexing circuit, the FEC decoder circuit configured to perform FEC decoding on the FEC coded sequence.

14. The communication system of claim 13, wherein the alignment marker detection circuit is further configured to align data lanes of the data sequence.

15. The communication system of claim 10, further comprising:
an intermediate communication circuit, coupled to receive the multiplexed sequence from the data bus having M data lanes, and configured to convert the multiplexed sequence to a format for transmission over O data lanes, and transmit the converted multiplexed sequence on a data bus having the O data lanes; and
a receiver circuit, including:

an alignment marker detection circuit configured to:
receive the multiplexed sequence from the data bus having the O data lanes; and
locate data symbol boundaries in the multiplexed data sequence;
a demultiplexing circuit coupled to the alignment marker detection circuit, the demultiplexing circuit configured to demultiplex the data sequence to produce an FEC coded sequence on a third set of N data lanes, the demultiplexing being performed at the located symbol boundaries in the data sequence; and
an FEC decoder circuit coupled to the demultiplexing circuit, the FEC decoder circuit configured to perform FEC decoding on the FEC coded sequence.

16. The communication system of claim 10, wherein the FEC encoding is Reed-Solomon encoding.

17. The communication system of claim 10, wherein a data width of each data lane of the second set of M data lanes is a multiple of a data width of the symbols.

18. A receiver circuit, comprising:
an alignment marker detection circuit configured to:
receive a multiplexed data sequence from a data bus having a first set of M data lanes; and
locate data symbol boundaries in the multiplexed data sequence;
a demultiplexing circuit coupled to the alignment marker detection circuit, the demultiplexing circuit configured to demultiplex the multiplexed data sequence to produce an FEC coded sequence on a third set of N data lanes, the demultiplexing being performed at the located symbol boundaries in the multiplexed data sequence; and
an FEC decoder circuit coupled to the demultiplexing circuit, the FEC decoder circuit configured to perform FEC decoding on the FEC coded sequence.

19. The receiver circuit of claim 18, wherein the alignment marker detection circuit is further configured to align data lanes of the multiplexed data sequence.

20. The method of claim 1, wherein the multiplexing is performed only at boundaries between sequential ones of the data symbols or the alignment markers of the FEC coded sequence in each of the first set of N data lanes.

* * * * *